US010998152B2

(12) United States Patent
Jahne et al.

(10) Patent No.: US 10,998,152 B2
(45) Date of Patent: May 4, 2021

(54) OPERATING DEVICE HAVING AN ILLUMINATED VOLUME CONTROL ACTUATING ELEMENT

(71) Applicant: STAGE TEC ENTWICKLUNGSGESELLSCHAFT FÜR PROFESSIONELLE AUDIOTECHNIK mbH, Berlin (DE)

(72) Inventors: Helmut Jahne, Berlin (DE); Detlef Kutschabsky, Berlin (DE); Harald Klaus, Berlin (DE); Arno Schünemann, Berlin (DE)

(73) Assignee: STAGE TEC ENTWICKLUNGSGESELLSCHAFT FÜR PROFESSIONELLE AUDIOTECHNIK mbH, Berlin (DE)

( * ) Notice: Subject to any disclaimer, the term of this patent is extended or adjusted under 35 U.S.C. 154(b) by 0 days.

(21) Appl. No.: 16/500,082

(22) PCT Filed: Mar. 29, 2018

(86) PCT No.: PCT/EP2018/058262
§ 371 (c)(1),
(2) Date: Oct. 1, 2019

(87) PCT Pub. No.: WO2018/185020
PCT Pub. Date: Oct. 11, 2018

(65) Prior Publication Data

US 2020/0111628 A1 Apr. 9, 2020

(30) Foreign Application Priority Data

Apr. 3, 2017 (DE) ..................... 10 2017 205 660.6

(51) Int. Cl.
*H01H 15/02* (2006.01)
*H01H 15/00* (2006.01)
(Continued)

(52) U.S. Cl.
CPC ........ *H01H 15/025* (2013.01); *H01H 15/005* (2013.01); *H01H 15/10* (2013.01); *H05K 5/0017* (2013.01)

(58) Field of Classification Search
CPC .. F21V 33/0056; F21V 23/04; F21V 33/0052; F21V 23/02; F21V 23/0435
(Continued)

(56) References Cited

U.S. PATENT DOCUMENTS 3,909,770 A 9/1975 Oka et al.
4,504,818 A * 3/1985 Okuya .................. H01C 10/14 338/119

(Continued)

FOREIGN PATENT DOCUMENTS

CN 104078261 A 10/2014
DE 2412558 A1 9/1975

(Continued)

*Primary Examiner* — William J Carter
(74) *Attorney, Agent, or Firm* — Bonini IP Law, LLC; Frank J. Bonini, Jr.

(57) ABSTRACT

An operating device (1) having an illuminated level control actuating element, in particular for audio systems, comprising a level control (10) which has an actuating element (40) movable along an adjustment path (20). In the interior, the actuating element (40) comprises a light guiding section (160) by which light coupled into a coupling section (130) on the lower side face of the actuating element (40) is guided to one or more exit zones (170) of the gripping faces (60) of the actuating element (40), and a plurality of illumination means (100) which are controllable for individual positioning are arranged along the adjustment path (20), such that in any position of the level control (10) along the adjustment path (20) the actuating element (40) covers at least one of the illumination means (100) with the lower side face of the actuating element.

20 Claims, 4 Drawing Sheets

(51) Int. Cl.
*H01H 15/10* (2006.01)
*H05K 5/00* (2006.01)

(58) Field of Classification Search
USPC .................................................... 362/85, 86
See application file for complete search history.

(56) References Cited

U.S. PATENT DOCUMENTS

| | | | | |
|---|---|---|---|---|
| 4,646,206 | A | 2/1987 | Bauer et al. | |
| 6,627,829 | B2 * | 9/2003 | Sato | H01H 9/181 362/23.04 |
| 9,728,350 | B2 | 8/2017 | Müller | |
| 2007/0274062 | A1 | 11/2007 | Huber | |
| 2008/0310142 | A1 * | 12/2008 | Huber | G11B 27/038 362/85 |
| 2013/0271950 | A1 * | 10/2013 | Park | F21V 3/049 362/23.07 |
| 2015/0378456 | A1 | 12/2015 | Ho et al. | |
| 2016/0055988 | A1 | 2/2016 | Muller | |

FOREIGN PATENT DOCUMENTS

| | | | |
|---|---|---|---|
| DE | 3411302 | A1 | 10/1985 |
| DE | 3442372 | A1 | 5/1986 |
| JP | S5663005 | U | 5/1981 |
| JP | S5868005 | U | 5/1983 |
| JP | 2001085205 | A | 3/2001 |
| RU | 2462842 | C2 | 12/2010 |
| WO | 9828760 | A2 | 7/1998 |
| WO | 2005020485 | A2 | 3/2005 |

* cited by examiner

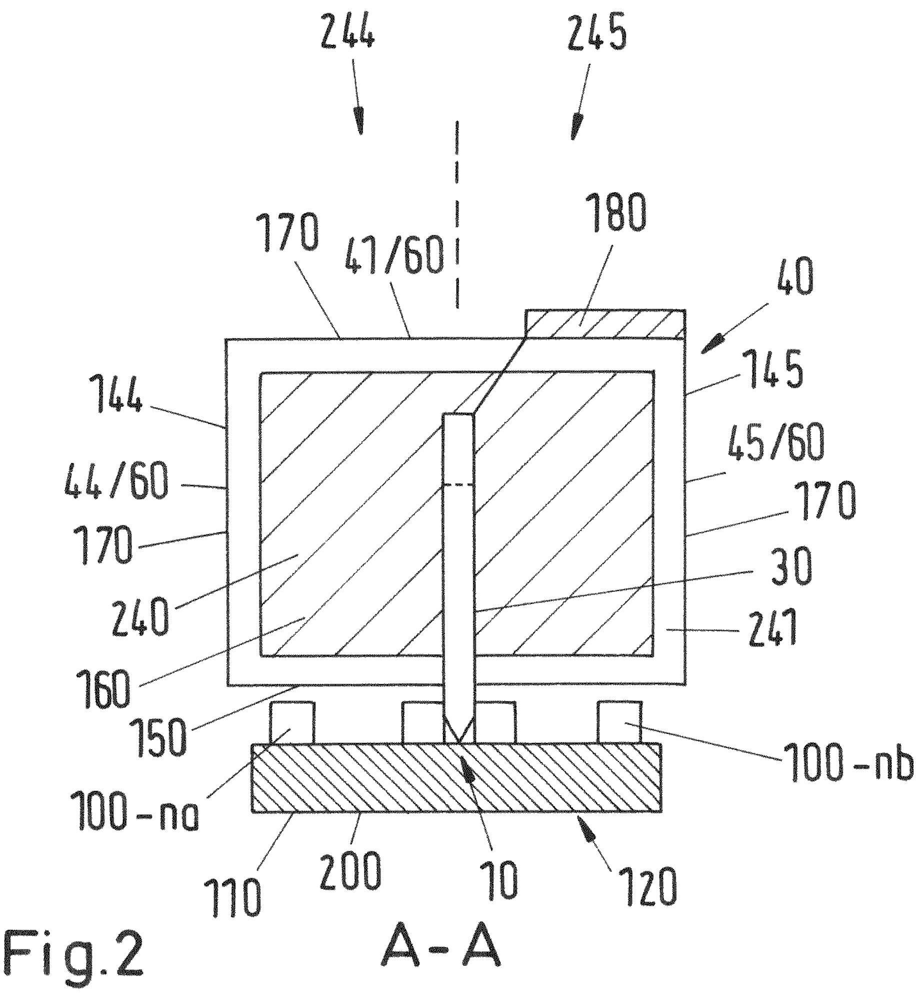
Fig.2 A-A
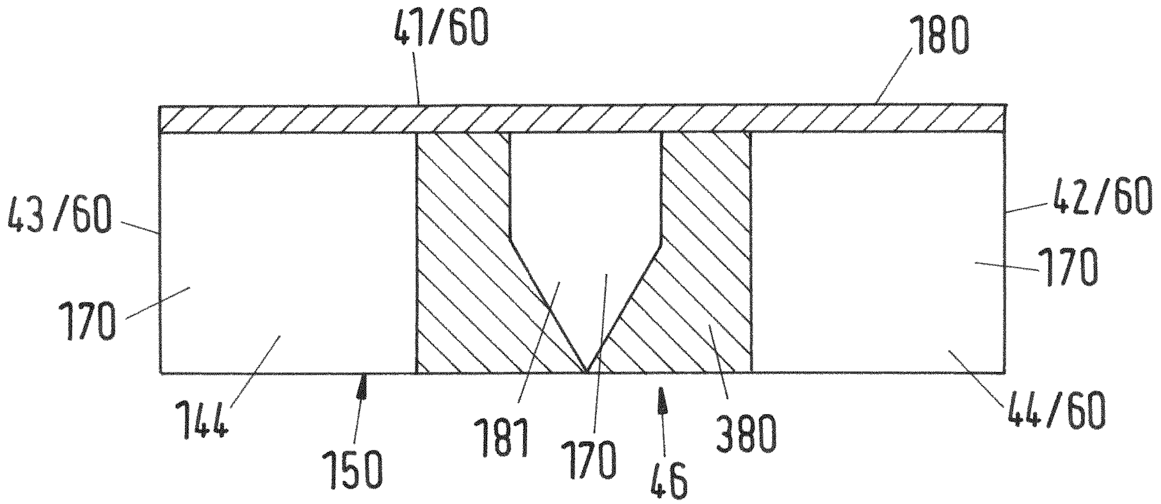
Fig.3

OPERATING DEVICE HAVING AN ILLUMINATED VOLUME CONTROL ACTUATING ELEMENT

BACKGROUND OF THE INVENTION

1. Field of the Invention

The invention relates to an operating device with a level control, as used in particular in sound mixing desks in the field of audio engineering.

2. Brief Description of the Related Art

In the field of audio engineering, the demands placed on mixing desks, in particular digital mixing desks, are increasing with regard to the number of audio signals which are to be processed via a sound mixing desk. It is customary to associate each signal for operation to a so-called channel strip.

A channel strip usually comprises a level control, which is linearly movable along an adjustment path, and different numbers of knobs and buttons. On an operating interface those control elements of a channel strip are arranged in an operating strip. An operating interface of a sound mixing desk therefore has a multiplicity of identical channel strips or operating strips.

Since a size of the operating interface is limited, it is common for modern mixing desks to assign multiple sound signals to a channel strip or an operating strip. This is called a multiple assignment. Only one of these multiple audio signals can be operated at a time via the control elements of the channel strip or the operating strip. Besides individual tone signals also other signal types and functionalities can be assigned to channel strips. For example, there exist input channels, group channels, control group-channels, effect channels, player channels or sum channels, to name a few. Hence the control elements of one operating strip can be assigned a different channel/different sound signal/different functions at different times.

Originally it was customary to label the operating strip or channel by hand. In the course of technical development, it has become common practice, to implement the channel labelling via electronic displays. Now the channel label changes with each change of assignment of the control element on the operating interface, so that it is recognizable which signal is being activated at any time. However this type of labelling leads to an extension of the operating times, since it is first necessary to grasp via the label which functionality an operating strip currently fulfils and/or which signal can be influenced via the operating strip.

From the WO 2005/020485A2 a slider control for a sound mixing desk is known, in which a slider can be moved along a limited path in a slot-shaped opening in a front panel. In order to create such a slider control, which clearly indicates which function it performs or which parameters it can influence by its position, an illuminable element is provided, which runs along the opening. Light of an illumination means, which is designed as a multi-coloured light-emitting diode, is radiated into the illuminated element. At least the type of channel assignment can thus be represented by a colour. With the dynamic change of assignments of the operating strip the colour of the light that is being fed into the illuminated element along the slot of the slider control, also changes.

SUMMARY OF THE INVENTION

The invention is based on the technical problem to develop an improved operating device with a level control, in particular for sound mixing desks.

The problem is solved by an operating device with the features of the invention. Advantageous embodiments of the invention will become apparent from the dependent claims.

The invention is based on the finding that the solutions known from the prior art, in particular in dark environments, in which audio mixing consoles must be frequently operated, for example in theatres, the labels next to a level control on an operating interface, for example a dB-scale, are difficult to observe, because a viewer looks at the bright illuminated elements next to or in the slots of the level control. Due to the adaption of the human pupil, this leads to a "dimout" of the labels and other elements on the operating interface, which are not actively illuminated. The advantage of the invention is that only the actuating element itself "lights up". Furthermore, the detection of the position of level control is facilitated, as this is highlighted due to the illumination compared to the operation interface.

In particular an operating device with a level control is provided, which has an actuating element, which is movable along an adjustment path, wherein the actuating element comprises a bottom face surface and outer gripping surfaces. The actuating element comprises, in the interior, a light guiding section which guides light coupled in, in a coupling section on the lower side surface of the actuating element, to one or more exit zones of the gripping surfaces of the actuating element. Along the adjustment path is a plurality of separately, preferably adjustment path position-individually or individually, controllable illumination means arranged so that the actuating element covers in each position of the level control along the adjustment path at least one of the illumination means with the coupling section of its lower side surface and that the illumination means and the level control are connected to a control device, which activates based on the position of the level control only the illumination means for light emission, which are covered by the coupling section of the actuating element.

Adjustment path position-individual is to be understood as a control wherein all illumination means that are arranged at the same position along the adjustment path can be controlled together, but independently and possibly different from other illumination means at other positions along the adjustment path. The control is therefore dependent on the position along the adjustment path. An even finer subdivided control is achieved with an individual control, in which each illumination means can be controlled individually and independently of other illumination means.

The actuating element, which is also referred to as a control knob, level control knob or fader knob, has a lower side surface, which, when installed in an operating interface, faces the operating interface. The remaining outer surfaces of the actuating element are here referred to as gripping faces, since these can be touched and/or gripped by a human hand whilst manually moving the actuating element along the adjustment path.

A good light guiding of the light coupled in in the area of the coupling section, in particular to different exit zones or different gripping faces of the actuating element, is achieved by an embodiment in which the light-guiding section comprises a translucent, diffusely scattering material in the interior. A translucent material is a material which is light-transmissive. Material which is translucent and trough which images according to the geometrical optics is possible, is here referred to as transparent or clear. In the translucent material proposed here, the conduction of light is caused by a diffuse scattering at scattering centres in the interior of the material.

However, in alternative embodiments, the light guiding section can also be realized by a transparent material. This is, preferably at least partially, coated with reflective material.

A surface of the coupling section is preferably plane and flat. As a result, a good coupling in of light is achieved in the actuating element.

In order to reduce reflections at the surface of the coupling section one embodiment is configured such that the surface is provided with an antireflection coating. Such coatings consisting of several thin layers are known from the field of optics, for example ophthalmic optics.

In order to achieve a good grip, the gripping faces, in particular on a top face, which is positioned opposite the bottom face surface, can be contoured and/or structured.

To further reduce the glare of an operating person, it is in one embodiment intended that at least one of the gripping surfaces of the actuating element has an opaque cover with at least one clearance as the exit zone or one of the exit zones.

The shape of the clearance may represent, for example, a symbol, an alphanumeric character, an alphanumeric character string or the like. Thereby a distinctness of different operating strips on a sound mixing desk can be achieved.

Preferably, a top face and possibly a front and/or a back face of the actuating element are covered with the opaque cover, for example with an opaque coating. The outer surfaces of the actuating element, which are orientated substantially perpendicular to the orientation of the adjustment path are designated as the front side and the back face. These covers may, but don't need to, each have a clearance as one of the light exit zones.

In order to be able to reliably detect a contact of the actuating element, it is provided in some embodiments that at least one contact section of one of the gripping faces of the actuating element is electrically conductively connected to a lever/slide of the level control on which the actuating element is mounted, wherein the lever/slide in turn is electrically coupled to a sensor for detecting a contact of the actuating element.

The sensor for detecting the contact may be realized in the operating device or may be connected to the operating device. If a contact by a user's hand with the actuating element is detected, the sensor generates a contact signal which is provided in order to be able to control functionalities, for example in a mixing desk, in which the operating device is integrated. Such a sensor is also referred to as a contact sensor.

The contact section can be formed, for example, on the gripping faces using a conductive coating. In some embodiments, the opaque cover is made conductive so that the opaque cover can form the contact section of the actuating element. The opaque cover may be formed, for example, as opaque conductive coating. However, it is also possible in other embodiments, to form the contact section fully or partially by using transparent conductive coatings. For example, tin oxide coatings and other transparent oxide coatings are suitable for this purpose.

In particular, when the clearances in the opaque cover are filled with a transparent conductive coating, the entire gripping face of the actuating element can be made electrically conductive. Likewise, embodiments are possible in which the entire gripping face is formed with a transparent conductive layer.

Another advantage of the invention is that a halo of the exiting light, which exits the one exit zone or the several exit zones, in particular at the side surfaces, of the actuating element, leads to an illumination next to the actuating element of the level control. Also light, which emerges from exit zones on a front face and/or back face of the actuating element, may contribute to an advantageous illumination of the environment of the actuating element.

In addition, the opaque cover may be designed to be reflective on a side facing the interior of the actuating element in order to improve a light guiding to one or both side surfaces and/or also to the front and/or back face of the actuating element.

If the level control is integrated into an operating interface, for instance, a dB scale is illuminated. The perceptibility is thus significantly improved in comparison to the embodiments of the prior art.

For this purpose, some embodiments provide that the exit zone or one of the exit zones is formed on a side surface of the actuating element, the side surface being oriented parallel to a direction of the adjustment path.

In order to improve the readability of the exact position of the actuating element on a scale formed next to the level control, it is intended in some embodiments that the exit zone or one of the exit zones, for example on the side surface and/or the top face of the actuating element, has the shape of a reading mark.

The side surface or the top face is at least partially provided with an opaque cover, for example opaque coating, of the area around the reading mark, which is designed as an exit zone. However, this coating does not have to be full-faced to produce the reading mark.

In one embodiment, for example, the reading mark may be formed as a stripe-like or line-like clearance in an opaque cover extending over both side surfaces and the top face in at least one section of the actuating element, in which the line or stripe-like clearance on the top face is preferably aligned perpendicular to the orientation of the adjustment path. The reading mark can also be formed only in the top face or only in a side surface.

Alternative embodiments provide that the reading mark is formed as opaque coating in an exit zone.

In order to avoid and minimize glare by the light emitted by the illumination means also when viewing the level control or the actuating element obliquely, it is provided in one embodiment that the coupling section is at the bottom face surface is surrounded by a, preferably circumferential, opaque ridge or an opaque frame. As a result, leakage of light, which is adjacent to the coupling section, is avoided on the bottom face of the actuating element. The ridge or the frame is preferably black.

This ridge or frame preferably projects from the bottom face surface. In this way, glare by observing oblique can be further reduced. Light reflected or scattered at an entrance surface of the coupling section can be blocked by the ridge or the frame. A view on the coupling section can be prevented or at least significantly reduced.

A distance between a plane in which the light exit surfaces of the illumination means are arranged, and a lower edge of the ridge or the frame (measured along the surface normal of the plane) is chosen as small as possible.

Alternatively or additionally, an operating interface can have an opaque circumferential frame which protrudes from the plane of the operating interface and encloses the area which is swept by the actuating element as it moves along the adjustment path.

In order to be able to display the functional assignment of the level control to a signal type or a specific signal in a simple manner, it is provided in some embodiments that the separately controllable illumination means are each multi-coloured illumination means, wherein the colour of the emitted light is adjustable by the control device.

Embodiments are preferred in which the multi-coloured illumination means are RGB light-emitting diodes each. Illumination means, which are designed as light-emitting diodes, can easily be controlled. Furthermore, these illumination means only produce a very small amount of waste heat. In addition, RGB light-emitting diodes can span a very large gamut, so that many different colours of light can be coupled into the actuating element.

Alternatively or additionally to identifying the signal type via a colour, it is also possible to display a position of the actuating element along the adjustment path via the colour of the coloured light generated by the illumination means. A position of the level control can be displayed, for example, via a colour saturation of the colour tone, whereas the colour tone indicates the functionality.

Some embodiments provide uniform and constant brightness of the exit zones.

In order to enable a uniform illumination, it is provided in some embodiments that the illumination means are arranged in a uniformly distributed way along the adjustment path.

In some embodiments the illumination means are arranged on one side along the adjustment path. The required installation area can hereby be minimized.

In particular, when an improved illumination next to the actuating element on both side surfaces is desired or a homogeneous illumination at the top face and/or front face and/or back face, in particular transversely to the adjustment direction, i.e. transverse to the adjustment path, is to be improved, embodiments are advantageous in which the illumination means are arranged on both sides of the adjustment path.

In fact, in most embodiments, the lever on which the actuating element is arranged, hinders a guiding of light in the interior of the actuating element from one side half, in which the light coupling of the illumination means that are arranged on one side of the adjustment path occurs, to the other half or side surface. Thus coupling of light in both halves is advantageous. The side halves are defined here in relation to the lever.

In order to insure an equally bright and continuous illumination or a brightness, which is constantly changing according to a functional relationship, for example increasing linearly, whilst adjusting the actuating element or the level control along the adjustment path, it is provided in preferred embodiments, that the actuating element covers at least two of the separately controllable illumination means, which are arranged at different positions along the adjustment path, simultaneously. Thus, it can be reliably achieved that, regardless of the specific position of a single illumination means relative to the actuating element, a constant or desired coupling of light always takes place. In an unfavourable positioning of said one illumination means relative to the actuating element, which means if this is located at the edge of the coupling section, an additional light coupling can be effected via the at least one further covered illumination means, which compensates for a reduced light guiding of the light coupled in at an edge position of the coupling section by the light coupled in by said one illumination means.

An advantageous embodiment of the invention thus provides that the control device is designed to simultaneously control the illumination means that are covered by the actuating element individually or adjustment path position-individually with regard to their light intensity, so that the emission of light at the exit zones has a constant intensity independent of a position of the level control.

Some embodiments provide that the coupling section of the actuating element in each case covers at least two illumination means, which are arranged on the same side along the adjustment path, at the same time.

In other embodiments, the actuating element covers at least two illumination means on each side of the adjustment path.

In order to be able to display a rapid transition of a change in an assignment of the level control, the control device has a function signal input in some embodiments, via which a function signal can be detected. The control device is also designed to determine a chromaticity of the illumination means in dependence of the function signal.

In order to achieve a uniform chromaticity of the light conducted in the actuating element to the exit zone/exit zones, it is provided in some embodiments that the control device is designed to adjust the chromaticity of the illumination means, which are simultaneously activated, identically. Which means that the illumination means emit light of the same colour.

The usually partially predetermined division of the actuating element into two halves, due to the lever, is completely realized in some embodiments, so that the actuating element has two separate halves with respect to a guiding of light in the interior of the actuating element.

In particular, in embodiments having such an actuating element with two separate halves with respect to the guiding of light, but also in other embodiments, the control device may be configured to adjust the chromaticity of the illumination means that are simultaneously activated to emit light, which are arranged on one side of the adjustment path, identically and the chromaticity of the illumination means which are arranged on an opposite side of the adjustment path, each identically, but adjusted with a different chromaticity than the illumination means on one side of the adjustment path. If, for example, a clearance in the opaque cover is provided on the top face of each half, respectively, as exit zone, then they can be backlit in different colours. That way it is possible to display a function assignment and, for example, a position of the level control at the same time via the colour. Also, the ability to indicate group affiliations of the channel via one colour and another functional feature by the other colour is created. There are many design options, to use a simultaneous differently coloured illumination or backlighting of clearances in the opaque coated top face, front face, back face or side surfaces.

Also a temporal change of the light intensity can be used to transmit information, without changing the chromaticity of the light used. In this way, for example, the level control can be highlighted, compared to other level controls in an operating interface to direct a person's attention to this level control.

As a rule, the level control of the operating device is integrated into an operating interface. In this case, it is provided that the lever, on which the actuating element is mounted, extends through a slot formed as a clearance hole of the operating interface, wherein the slot is oriented parallel to the adjustment path. The slot thus corresponds to the adjustment path of the level control. The lever, to which the actuating element is attached, is linearly displaceable in the slot, which is formed as a clearance hole, of the operating interface during adjustment along the adjustment path.

In some embodiments, it is provided that the illumination means are embedded laterally next to the slot in the operating interface. This makes it possible to form a very narrow slot in the operating interface.

In other embodiments, the illumination means are arranged in the area of the slot. Light exit surfaces of the illumination means can be arranged in the plane of the operating interface or below the plane of the operating interface.

In other embodiments, it is provided that the illumination means are arranged along the slot.

Preferably, the level control is provided with a drive unit, so that the actuating element is displaceable, into each position along the adjustment path via the drive unit, which is connected to the control device, alternatively to a manual adjustment. Such level controls are also referred to as motor level control. With such a level control rapid scene changes are possible in which stored positions of the level control are produced via the drive unit.

BRIEF DESCRIPTION OF THE DRAWING FIGURES

Hereinafter, preferred embodiments will be explained in more detail with reference to drawings. They show:

FIG. 2 is a schematic sectional view taken along intersection line A-A;

FIG. 3 is a schematic sectional view of an actuating element;

DETAILED DESCRIPTION OF THE INVENTION

Figure 1:
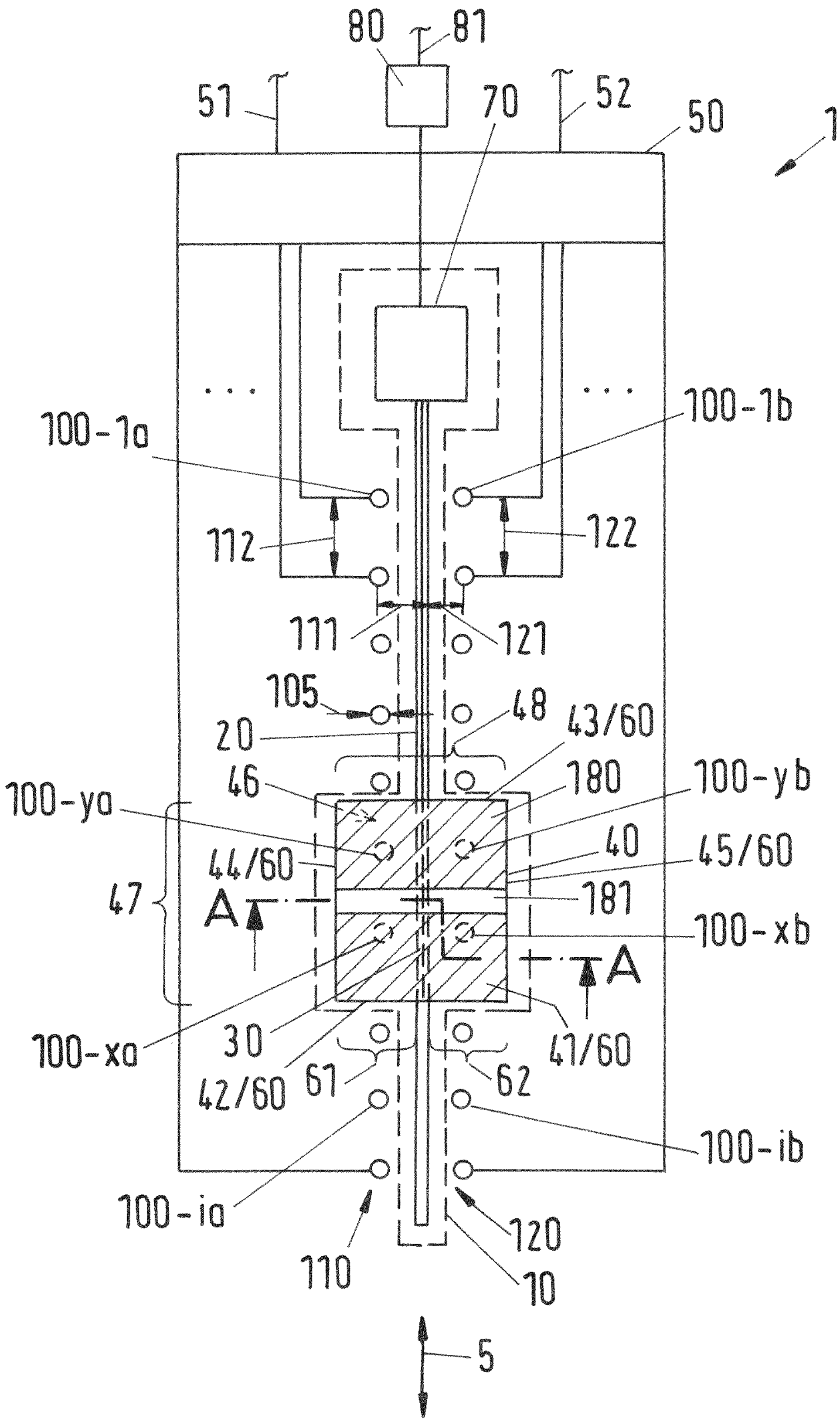
FIG. 1 is a schematic plan view of an operating device.

FIG. 1 shows schematically an operating device 1. The operating device 1 comprises a level control 10. Along an adjustment path 20, a lever 30 of the level control 10 is linearly displaceable. In order to be able to operate the lever 30 manually, the level control 10 has an actuating element 40. Depending on the position of the lever 30 or of the actuating element 40 along the adjustment path 10, a parameter signal is provided at an output 51 by a control device 50. The position of the actuating element correlates with a parameter value or a level control value.

The level control 10 is preferably designed as a so-called motor level controller. In order to be able to actively shift the lever 30 and the actuating element 40 thereon to any desired position along the adjustment path 20, such a level control 10 has an actuator 70 which can move the lever 20 back and forth along the adjustment path 20. The actuator 70 is preferably controlled via the control device 50.

The actuating element 40 is mounted on the lever 30. The lever has at this end, as a rule, a T-shaped design. On this end, the actuating element 40 is preferably attached by means of a snap-in connection. The actuating element 40 has a top face 41, a front face 42, a back face 43, a left face 44, a right face 45 and a bottom face 46, which faces the plane of the drawing. Those side surfaces of the actuating element 40, which can be touched by a user during a manual adjustment of the actuating element 40 along the adjustment path 20, are also referred to as gripping faces 60. Thus, the surfaces of the top face 41, the front face 42, the back face 43, the left face 44 and the right face 45 are the gripping faces 60.

Adjacent to the adjustment path 20, along which the lever 30 of the level control 10 can be displaced, a multiplicity of illumination means 100, 100-*na*, 100*nb* is arranged. (n is in each case a counting index) The illumination means 100-*na*, 100-*nb* are each coupled with the control device 50 so that each of the illumination means 100 can be activated individually or adjustment path position-individually. In a variant in which an individual control of the illumination means 100 is possible, the control device can control each individual illumination means 100-*na*, 100-*nb* in such a way that this illumination means emits light or does not emit light. In an embodiment in which the activation occurs adjustment path position-individually, the control device can control the illumination means depending on their position along the adjustment path 20. Illumination means 100-*na*, 100-*nb*, which have the same position along the adjustment path but are arranged, for example, on the different sides of the adjustment path 20, can then be actuated together but separately from illumination means at other positions. In the illustrated embodiment an individual activation depending on the position along the adjustment path means, that the illumination means are each activated in pairs. Thus, an individual activation occurs for each position, but not necessarily an individual activation of the illumination means 100 arranged at the same position long the adjustment path. An individual activation thus permits an even greater variety of settings than an adjustment path position-individual activation, in particular with regard to a homogeneous illumination, in particular transversely to the adjustment path. In preferred embodiments, the control device 50 can also control the intensity of the emitted light adjustment path position-individually for the illumination means 100. The number of required control circuits is reduced compared to individual control of each illumination means.

Other embodiments may provide that also the illumination means arranged at the same position along the adjustment path can be controlled individually.

In the illustrated embodiments the illumination means 100 are divided into two groups 110, 120 of illumination means 100. One of the groups 110 of illumination means 100-*na* is arranged on one side of the adjustment path 20, the other group 120 of illumination means 100-*nb* is arranged on the opposite side of the adjustment path 20. (The suffixed letters a and b indicate a group affiliation or "side affiliation".) Within the groups 110,120, the illumination means 100-*na*, 100-*nb* are each arranged spaced with regard to each other along the adjustment path 20. A longitudinal distance 112,122 of the illumination means 100 between two adjacent illumination means on the same side of the adjustment path 20 is thus the same for all illumination means of this side of the adjustment path 20.

The illumination means 100 each have an identical diameter 105 of the illumination means. In other embodiments, the diameter 105 of the illumination means may vary slightly. The light exit surfaces of the illumination means 100 are preferably as homogeneous as possible, which means similarly designed in shape, surface and texture.

The illumination means 100 are preferably multi-coloured illumination means, which are also referred to as coloured illumination means. This means that a single illumination means is able to emit light of different wavelengths. The illumination means 100 are especially preferably each designed as RGB LEDs. An RGB LED contains semiconductor structures that can emit light in the red, green and blue wavelengths region. By varying the intensities of the different wavelengths, it is possible to generate a plurality of colours of a gamut (colour space) due to the additive colour mixture. Depending on the different intensity ratios of the three emitted wavelengths or emitted spectra of the different semiconductor structures, a human observer perceives a colour from the gamut for the emitted light. The colour of the light perceived by a human observer can thus be adjusted via the control device 50 for each of the illumination means 100.

The actuating element 40 has a length 47 and a width 48. The length 47 of the actuating element is measured parallel to the adjustment path 20 of the level control 10, the width 48, however, perpendicular to the adjustment path 20 of the level control 10. An adjustment direction 5 is oriented parallel to the adjustment path 20 and indicates the direction along which the actuating element 40 and the lever 30 of the level control 10 can be moved back and forth.

The width 48 of the actuating element 40 is adjusted to lateral distances 111 and 121 of the illumination means 100-*na* or 100-*nb* to the adjustment path in a way, so that the actuating element 40 completely covers at least one illumination means 100 in each position.

In the illustrated embodiment of FIG. 1, in which a group 110 of illumination means 100-*na* is arranged on one side of the adjustment path and the other group 120 of illumination means 100-*nb* on the opposite side of the adjustment path, the actuating element 40 is formed so that the actuating element 40 completely covers several of the illumination means 100 at a time in each position along the adjustment path 20.

A width 48 of the actuating element 40 is thus adequately selected, that illumination means 100-*na* on one side of a group 110 as well as illumination means 100-*nb* of the opposite group 120, are covered in any position along the adjustment path 20. A width 48 of the actuating element is thus greater than a transverse distance of adjacent illumination means 100-*na*, 100-*nb* on the opposite sides of the adjustment path. Projections 61, 62 of the actuating element laterally beyond the lever 30 are thus greater in each case than the sum of a lateral distance 111, 121 and the diameter 105 of one illumination means.

In the illustrated embodiment, the length 47 of the actuating element 40 is greater than the sum of the double of the diameter 105 of the illumination means and the longitudinal distance 112, 122 of adjacent illumination means 100, which are each on the same side of the adjustment path 20 of the lever 30.

In the illustrated embodiment, at least two of the illumination means 100-*na*, 100-*nb* of the two groups 110, 120 of the illumination means, are respectively covered on each side of the adjustment path 20 by the bottom face 46 of the actuating element 40, which faces the plane of the drawing. In the illustrated position of the actuating element, the lighting means 100-*xa*, 100-*ya*, 100-*xb*, 100-*yb* are covered.

The bottom face 46, which is facing the plane of the drawing, has a coupling section 150. Via this coupling section 150 light, which has been emitted by the illumination means 100, which are covered by the bottom face 46 of the actuating element 40, can be coupled into the interior of the actuating element 40. In its interior the actuating element 40 has a light guiding section 160, which guides the light coupled in to one exit zone 170 or several exit zones 170. The exit zone 170 or the exit zones 170 are formed in the gripping faces 60 of the actuating element.

In order to avoid glare by the illumination means 100, the control device 50 is designed in a way, so that it only activates those illumination means 100 to emit light, which are fully covered by the actuating element 40. In the exemplary embodiment shown, these are the illumination means labelled with the reference symbols 100-*xa*, 100-*ya*, 100-*xb*, 100-*yb*. The control device 50 is formed to deactivate the illumination means, which are not covered, or activate them in a way, so that they don't emit any light. Only those illumination means 100 that are fully covered by the actuating element 40 are being activated to emit light.

The illumination means 100 are preferably activated and adjusted by the control device 50 so that they emit identically coloured light, when they emit light.

Other embodiments may provide that the colour of the respectively emitted light is dependent on the position of the respective covered illumination means along the adjustment path 20.

In some embodiments, the actuating element is designed so that all gripping faces are light transmissive. In this case, the illumination element is illuminated from all sides, as long as light is coupled in via the coupling section 150.

However, to avoid or reduce glare, especially in dark work environments, in some embodiments, at least a subarea of the top face and optionally additionally the front face and/or the back face and/or the left face and/or the right face of the actuating element 40 provided with an opaque coating 180. At least on one of these sides, the opaque cover, for example in the form of an opaque coating 180, has a clearance 181 which serves as an exit zone 170.

In the illustrated embodiment, the exit zone 170 is designed as linear clearance 181 in an opaque coating 180, which means in an opaque cover, of the top face 41 of the actuating element 40. Light, which has been coupled into the actuating element 40 from the bottom face 46, thus exits the actuating element 40 from the clearance 181, which is an exit zone 170. Thus a bright luminous stroke appears on the top face 41 of the control element 40. This is perceived in the colour which corresponds to the colour of the light which is coupled into the coupling section 150 by covered illumination means 100 and guided through the light guiding section 160 to the exit zone 170.

The linear clearance 181 can be used as a reading mark for a scale (not shown), which is optionally arranged next to the level control.

The opaque cover 180 is preferably formed of a conductive material and electrically conductive connected with the lever 30 either in the interior of the actuating element or along the outer surfaces of the actuating element. This makes it possible to connect a sensor 80, which is called a contact sensor, to the level control. This can detect the contact of a user with the opaque cover. The sensor 80 preferably has a contact signal output 81, via which a signal is provided which indicates the contact of a user.

In alternative embodiments, the clear coating, which is transparent, may also be made conductive. Since the contact sensors can also partially evaluate a capacitive coupling of a body part to the actuating element 40 or a gripping face 60 of the actuating element 40, the entire gripping face 60 of the actuating element does not have to be electrically conductive in each case in order to reliably detect every contact.

Preferably, at least one left face surface 144 and/or one right face surface 145 on the left face 44 or the right face 45 may have an exit zone. For example, the left face 44 and/or the right face 45 may be formed over the whole area as an exit zone. An advantage of arranging an exit zone on the left face and/or the right face 45 is that light exiting at the faces 44, 45 or the corresponding side surfaces 144, 145, can illuminate a part of an operating interface (not shown) or a part of scale, which is arranged hereupon. For this purpose, also a light emission from the front face and/or the back face of the actuating element 40 can be used.

In order to ensure the correct activation of the illumination means 100, the control device 50 is connected to the level control 10 so that the control device 50 can determine the position of the actuating element 40 and the lever 30. This way it is possible to select those illumination means 100-*xa*, 100-*xb*, 100-*ya*, 100-*yb* which, in the current position of the lever 30, are covered by the actuating element 40 located thereon. These illumination means 100-*xa*, 100-*xb*, 100-*ya*, 100-*yb* covered in the illustrated position are then activated to emit light. A colour of the emitted light is preferably set by the control device 50 according to a function associated with the level control 10 and the operating strip of a mixing desk in which the level control 10 is integrated. For this purpose, the control device 50 may have a function input 52. Via the function input 52, the control device 50 can be provided with, for example, a function signal of an operating logic of a digital sound mixing console. Based on the function signal, the control device 50 then determines the assigned function. Depending on the assigned function, it is preferable to determine the colour of the light that the illumination means 100 emits.

FIG. 2 shows a schematic sectional view according to the section line A-A of FIG. 1. The same technical features are provided in all figures with the same reference numerals. On a circuit board 200, the level control 10 with the lever 30 is arranged as well as illumination means 100 on both sides. An actuating element 40 is arranged on the lever 30. This is made in the interior of a diffusely scattering translucent material 240, which is covered with a translucent transparent, clear material layer 241 each at the bottom face 46, on the top face 41 and on the left face 44 and the right face 45, respectively. This clear material layer 241 is optional on each of the sides. The bottom face 46 and the translucent areas form the coupling section 150, which can be subdivided by the lever 30 into two coupling section parts 150*a*, 150*b*. Guided light passes through the clear material layer 241 on the bottom face 46 and enters the diffusely scattering material layer 240. Due to the diffuse scattering the light entering from below into the actuating element 40 is scattered in all directions, so that light emerges from all the surfaces of the diffusely scattering material 240 through the clear material layer 241.

Only on those areas where an opaque cover, for example, formed as opaque coating 180, is applied, a light emission from the actuating element 40 is prevented. On a bottom face, the opaque cover may be formed to be reflective, to reflect the light back into the diffusely scattering material 240. Alternatively or additionally to an opaque coating, areas of the actuating element 40 may also be made of opaque materials. However, it is essential that a light-guiding section 160 exists in the interior, which guides the light coupled in at the bottom face 46 to one of the outer surfaces, which means one of the gripping faces 60, of the actuating element and that an exit zone 170 is formed at least on one outer surface, which means on a gripping face.

In FIG. 2 can be clearly seen that the lever 30, which is usually made of a metallic material and thus formed opaque, hinders or prevents a guiding of light between a left half 244 and a right half 245 of the actuating element 40. Therefore, in the illustrated embodiment of FIG. 2 and the embodiment of FIG. 1 respectively on both sides of the level control 10, a group 110,120 of illumination means 100 is arranged. Thus, a uniform illumination of the level control, in particular of exit zones, which extend over the left half 244 and the right half 245, is possible.

However, other embodiments may also take advantage of this fact and form the actuating element so that the left half and the right half are isolated from each other with respect to the guiding of light in the interior of the actuating element. Both, on the top face as well as on the front face and the back face differently coloured clearances in an opaque cover can be generated, as differently coloured light is coupled into the different halves. This is achieved by the fact that the one group of illumination means arranged on one side of the level control emit light of one colour when they are covered by the control element and the illumination means on the other side of the level control which belong to another group of illumination means, emit light of a different colour, if they are covered by the actuating element.

FIG. 3 shows a schematic side view of a side surface, for example the left face surface 144. It can be seen that on the top face 41 a cover being formed as an opaque coating 180 is provided, which also extends over a part 380 of the side surface, which is shown hatched. In the opaque coating, a clearance 181 is formed in the form of a downward-pointing stylized arrow, which can be used as a reading mark. In the non-hatched areas of the side surface light emerges from the actuating element 40 when light is coupled into the actuating element 40 at the coupling section 150 at the bottom face 46.

In order to achieve the best possible illumination of an actuating element with only one illumination means or with two illumination means, which are arranged at the same position along the adjustment path 20, but on different sides of the level control 10, a central coupling would be optimal with respect to the longitudinal direction of the actuating element. However, if the actuating element is displaced along the adjustment path during actuation, the coupling in position(s) of the light emitted by the illumination means "wanders" or "wander" from the centre toward the front face or the back face, depending on the shifting direction. However, with light coupled in at the front face or back face of the bottom face, uniform illumination of the top face, for example, is significantly more difficult or impossible. Therefore, it is provided in the preferred embodiment that always at least two illumination means are covered at the same time along the displacement direction or the adjustment path, which are therefore located at different positions with respect to the displacement direction. Now these can be activated differently with respect to their radiated light intensity, so that in total the most possible uniform illumination of the actuating element is achieved.

Figure 4:
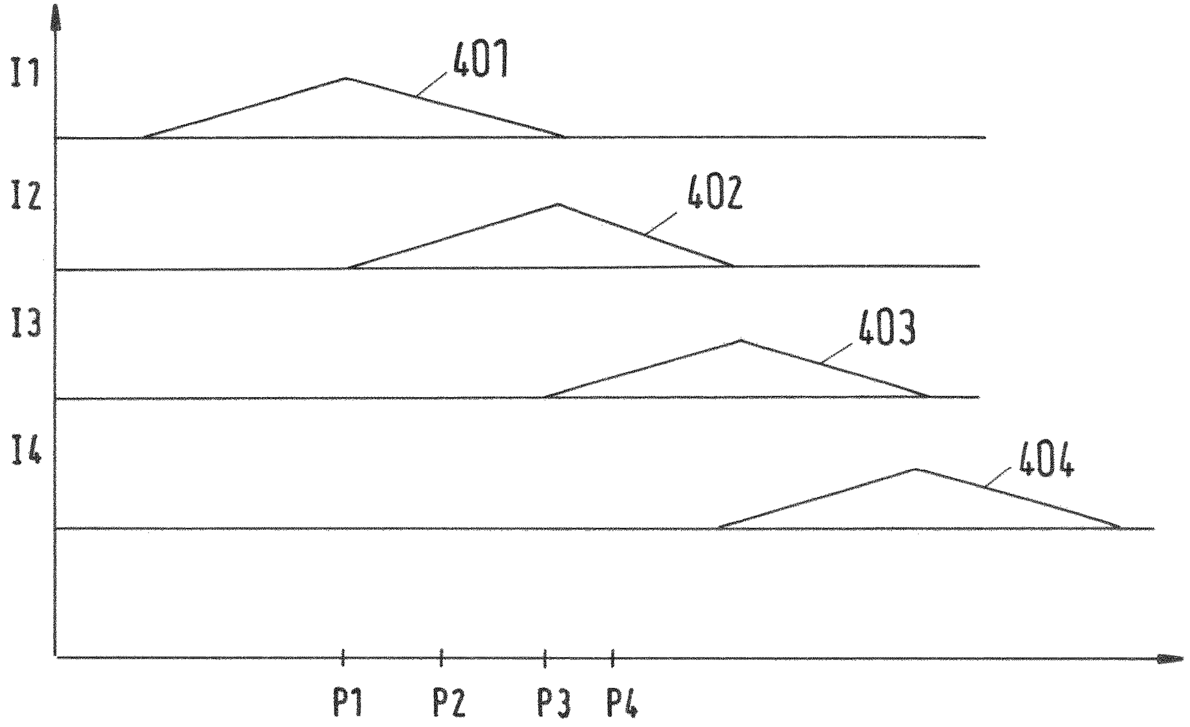
FIG. 4 is a schematic representation of light intensity control curves.

In FIG. 4, light intensity control curves 401-404 are plotted against the position P of the actuating element along the adjustment path for four illumination means arranged equidistantly on the same side of the adjustment path.

When the level control is in the position P1, the illumination means 100-1 is activated to emit light of maximum light intensity I1. The remaining illumination means 100-2-100-4 don't emit any light in this position. If the level control is moved to the position P2, the intensity I1 of the illumination means 100-1 is attenuated and at the same time the intensity I2 of the illumination means 100-2 is increased. If the level control reaches the position P3, then light with maximum light intensity I2 is emitted by the illumination means 100-2. When the level control is moved further in the direction of the position P4, the intensity I2 of the illumination means 100-2 is attenuated and now the intensity I3 of the light source 100-3 is increased. Depending on the position, the illumination means are thus controlled differently in order to achieve the most homogeneous possible illumination of the exit zones of the control element. The light intensity control curves shown here are only to be understood as examples. Other embodiments may have other forms. For example, more than two light sources along the adjustment path 20 can be covered by the adjusting element 40 at the same time.

Figure 5:
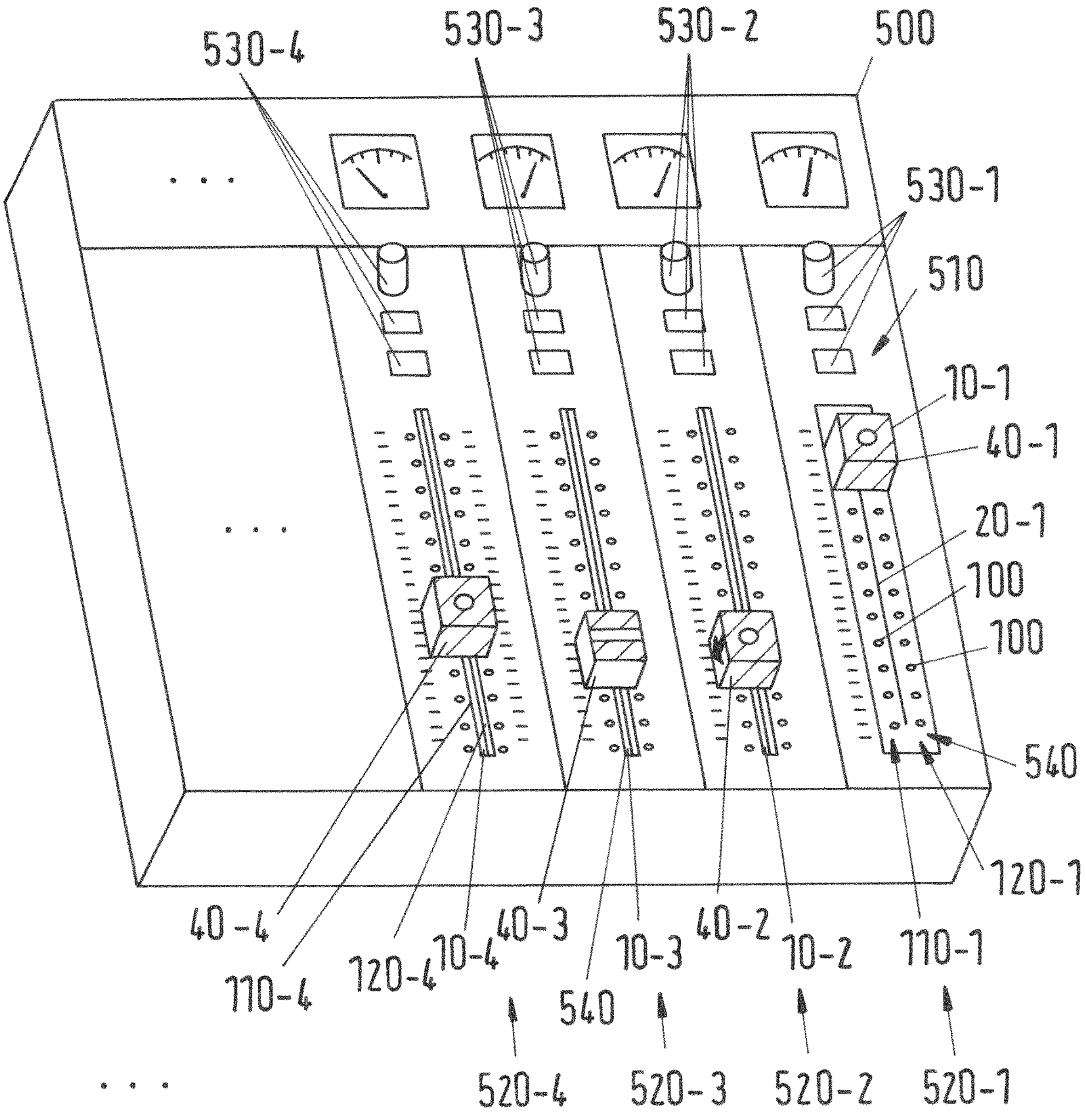
FIG. 5 is a schematic plan view of a mixing desk with multiple operating strips.

FIG. 5 schematically shows a plan view of a sound mixing desk 500. In an operating interface 510 a plurality of operating strips 520-*j* are formed, each having a level control 10-*j* as well as other control elements 530-*j*. In the operating interface slots 540-*j* are present, which are formed as clearance holes, in which the levers 30-*j* of the level control 10-*j* moves.

In the mixing desk shown different variants are shown. The slot 540-1 has such a width transversely to the adjustment path that the illumination means are arranged in the area of the slot optionally below the operating interface adjacent to the level control and still illuminate the actuating elements located above the operating interface by the coupling surface formed on the bottom face thereof.

In the embodiment of the remaining operating strips 520-2 to 520-4, the illumination means are embedded in the operating interface 510. The slots 540-2 to 540-4 are correspondingly narrower.

In the figures, only exemplary embodiments are described.

LIST OF REFERENCE NUMBERS

1 operating device
5 adjustment direction
10 level control
20 adjustment path
30 lever
40 actuating element
41 top face
42 front face
43 back face
44 left face
45 right face
46 bottom face
47 length
48 width
50 control device
51 output
52 function input
60 gripping face
61 projection
62 projection
70 actuator
80 sensor
81 contact signal output
100 illumination means
100-*n* illumination means
100-*na* illumination means with index n of group a
100-*nb* illumination means with index n of group b
100-*xa* illumination means with index x of group a
100-*xb* illumination means with index x of group b
100*ya* illumination means with index y of group a
100*yb* illumination means with index y of group b
105 diameter of the illumination means
110 a group of illumination means
111 lateral distance illumination means—adjustment path
112 longitudinal distance
120 another group of illumination means
121 lateral distance illumination means—adjustment path
122 left gap
150 coupling section
160 light guiding section
170 exit zones
180 opaque cover
181 clearance
200 circuit board
240 diffuse scattering material
241 clear material
244 left half
245 right half
380 part
401-404 light control curves
Pi Position i of the level control
500 sound mixing desk
510 operating interface
520-*j* operating strip j
530-*j* control elements of the operating strip j
540-*j* slot of the operating strip j

The invention claimed is:

1. An operating device with a level control, that comprises an actuating element having an interior, the actuating element being movable along an adjustment path, wherein the actuating element comprises a bottom face and outer gripping faces, characterized in that the actuating element comprises in the interior a light guiding section which, in a coupling section at the bottom face surface of the actuating element, conducts injected light to one or more exit zones of the gripping faces of the actuating element and along the adjustment path a plurality of separately controllable illumination means is arranged so that the actuating element covers in each position of the level control along the adjustment path at least one of the illumination means with its bottom face surface, and the illumination means and the level control are connected to a control device which activates based on the position of the level control only the illumination means for light emission, which are covered by the coupling section of the actuating element;

wherein the actuation element including said light guiding section moves along the adjustment path.

2. An operating device according to claim 1, thereby characterized in that the light guiding section comprises a translucent, in the interior diffusely scattering material.

3. An operating device according to claim 1, characterized in that the exit zone or one of the exit zones are formed on one side face of the actuating element, in which the side faces are orientated parallel to a direction of the adjustment path.

4. An operating device according to claim 1, characterized in that one gipping face of the actuating element has an opaque cover with at least one clearance as an exit zone or as one of the exit zones.

5. An operating device according to claim 1, characterized in that the exit zone or one of the exit zones has a form of a reading mark on one of the gripping faces.

6. An operating device according to claim 1, characterized in that the separately controllable illumination means are each multi-colored illumination means, wherein the colour of the emitted light is adjustable by the control device.

7. An operating device according to claim 6, characterized in that the multi-coloured illumination means are each RGB-light-emitting diodes.

8. An operating device according to claim 1, characterized in that the actuating element covers at least two of the separately controllable illumination means at the same time.

9. An operating device according to claim 1, characterized in that the illumination means are arranged uniformly distributed along the adjustment path.

10. An operating device according to claim 1, characterized in that the illumination means are arranged on one side along the adjustment path.

11. An operating device according to claim 1, characterized in that the illumination means are arranged on both sides of the adjustment path.

12. An operating device according to claim 1, characterized in that the control device is configured, to activate the illumination means being simultaneously covered by the actuation element, with regard to their illuminance, so that a light emission at the exit zone or the exit zones has a constant intensity independent of a position of the level control.

13. An operating device according to claim 12, characterized in that the coupling section of the actuating element covers at least two illumination means, which are on the same side of the adjustment path simultaneously.

14. An operating device according to claim 1, characterized in that the control device is configured to activate the illumination means, which are covered simultaneously by the actuating element, adjustment path position-individually with regard to their illuminance, so that a light emission at the exit zone or the exit zones has a constant intensity independent of the position of the level control.

15. An operating device according to claim 14, characterized in that the coupling section of the actuating element covers at least two illumination means, which are on the same side of the adjustment path simultaneously.

16. An operating device according to claim 1, characterized in that the control device has a function input via which a function signal is detectable, and that the control device is designed to adjust a chromaticity of the illumination means depending on the function signal.

17. An operating device according to claim 1, characterized in that the control device is configured to adjust the chromaticity of the illumination means, which are activated simultaneously for light emission, identically.

18. An operating device according to claim 1, characterized in that the illumination means are embedded in an operating interface and that a lever, onto which the actuating element is mounted, is during adjustment along the adjustment path linearly movable in a slot of the operating interface, which is designed as a clearance hole.

19. An operating device with a level control, that comprises an actuating element having an interior, the actuating element being movable along an adjustment path, wherein the actuating element comprises a bottom face and outer gripping faces, characterized in that the actuating element comprises in the interior a light guiding section which, in a coupling section at the bottom face surface of the actuating element, conducts injected light to one or more exit zones of the gripping faces of the actuating element and along the adjustment path a plurality of separately controllable illumination means is arranged so that the actuating element covers in each position of the level control along the adjustment path at least one of the illumination means with its bottom face surface, and the illumination means and the level control are connected to a control device which activates based on the position of the level control only the illumination means for light emission, which are covered by the coupling section of the actuating element, and further characterized in that at least one contact section of the gripping faces of the actuating element is electrically conductively connected to a lever of the level control on which the actuating element is attached, whereat the lever again is electrically coupled with a sensor for detecting a contact of the actuating element.

20. An operating device with a level control, that comprises an actuating element having an interior, the actuating element being movable along an adjustment path, wherein the actuating element comprises a bottom face and outer gripping faces, characterized in that the actuating element comprises in the interior a light guiding section which, in a coupling section at the bottom face surface of the actuating element, conducts injected light to one or more exit zones of the gripping faces of the actuating element and along the adjustment path a plurality of separately controllable illumination means is arranged so that the actuating element covers in each position of the level control along the adjustment path at least one of the illumination means with its bottom face surface, and the illumination means and the level control are connected to a control device which activates based on the position of the level control only the illumination means for light emission, which are covered by the coupling section of the actuating element; and further characterized in that the control device is configured to adjust the chromaticity of the illumination means being activated simultaneously for light emission, which are arranged on one side of the adjustment path, identically and to adjust the chromaticity of the illumination means which are arranged on an opposite side of the adjustment path each identically, but with a different chromaticity than the illumination means on said one side of the adjustment path.

* * * * *